United States Patent
Peck, Jr.

(10) Patent No.: US 9,568,563 B2
(45) Date of Patent: Feb. 14, 2017

(54) MAGNETIC CORE FLUX SENSOR

(71) Applicant: THE BOEING COMPANY, Chicago, IL (US)

(72) Inventor: James Leo Peck, Jr., Huntington Beach, CA (US)

(73) Assignee: The Boeing Company, Chicago, IL (US)

( * ) Notice: Subject to any disclaimer, the term of this patent is extended or adjusted under 35 U.S.C. 154(b) by 562 days.

(21) Appl. No.: 13/773,135

(22) Filed: Feb. 21, 2013

(65) Prior Publication Data

US 2014/0232383 A1 Aug. 21, 2014

(51) Int. Cl.
- *G01N 27/72* (2006.01)
- *G01R 33/00* (2006.01)
- *G01R 33/04* (2006.01)
- *H01F 27/40* (2006.01)

(52) U.S. Cl.
CPC .......... *G01R 33/0011* (2013.01); *G01R 33/04* (2013.01); *H01F 27/402* (2013.01)

(58) Field of Classification Search
CPC .................................................. G01N 27/72
USPC ........................................................ 324/239
See application file for complete search history.

(56) References Cited

U.S. PATENT DOCUMENTS

| 352,105 A | 11/1886 | Zipernowsky et al. |
|---|---|---|
| 2,411,374 A | 11/1946 | Horstman |
| 2,569,675 A | 10/1951 | Keefe |
| 2,780,771 A | 2/1957 | Lee |
| 3,042,849 A | 7/1962 | Dortort |
| 3,411,121 A | 11/1968 | Twomey |
| 3,451,130 A | 6/1969 | Ellis |

(Continued)

FOREIGN PATENT DOCUMENTS

| CN | 1444237 A | 9/2003 |
|---|---|---|
| CN | 1495435 A | 5/2004 |

(Continued)

OTHER PUBLICATIONS

European Patent Office, International Application No. PCT/US2013/072789 International Search Report and Written Opinion dated May 27, 2014, pp. 1-6.

(Continued)

*Primary Examiner* — Bot Ledynh
(74) *Attorney, Agent, or Firm* — Charles L. Moore; Moore & Van Allen PLLC

(57) ABSTRACT

A magnetic core flux sensor assembly may include a flux sensor core portion and at least one elongated opening for receiving a conductor winding through the flux sensor core portion. An electrical current flowing through the conductor winding generates a magnetic field about the conductor winding and a magnetic flux flow about the elongated opening. A plurality of pairs of sensor holes are positioned relative to the elongated opening for preventing significant disruption of the magnetic flux flow and for sensing the magnetic flux flow at different distances from an edge of the elongated opening. A sensor conductor winding passes through each pair of sensor holes. The magnetic flux flow generates an electrical signal in each sensor conductor winding. The electrical signal in a particular sensor conductor winding corresponds to the magnetic flux flow at a location of the particular sensor conductor winding.

21 Claims, 9 Drawing Sheets

(56) References Cited

U.S. PATENT DOCUMENTS

| | | | |
|---|---|---|---|
| 3,464,002 A | 8/1969 | Hentschel | |
| 4,020,440 A | 4/1977 | Moerman et al. | |
| 4,338,657 A | 7/1982 | Lisin et al. | |
| 4,520,335 A | 5/1985 | Rauch et al. | |
| 4,520,556 A | 6/1985 | Pasko et al. | |
| 4,565,746 A | 1/1986 | Hayase | |
| 4,668,931 A | 5/1987 | Boenitz | |
| 4,684,882 A | 8/1987 | Blain | |
| 4,897,626 A | 1/1990 | Fitter | |
| 5,351,017 A | 9/1994 | Yano et al. | |
| 5,486,756 A | 1/1996 | Kawakami et al. | |
| 5,534,831 A | 7/1996 | Yabuki et al. | |
| 5,534,837 A | 7/1996 | Brandt | |
| 5,668,707 A | 9/1997 | Barrett | |
| 5,737,203 A | 4/1998 | Barrett | |
| 6,144,282 A | 11/2000 | Lee | |
| 6,181,079 B1 | 1/2001 | Chang et al. | |
| 6,715,198 B2 | 4/2004 | Kawakami | |
| 6,995,646 B1 | 2/2006 | Fromm et al. | |
| 7,015,691 B2 | 3/2006 | Kang et al. | |
| 7,071,807 B1 | 7/2006 | Herbert | |
| 7,106,047 B2 | 9/2006 | Taniguchi | |
| 7,148,675 B2 | 12/2006 | Itoh | |
| 7,342,477 B2 | 3/2008 | Brandt et al. | |
| 7,362,206 B1 | 4/2008 | Herbert | |
| 7,378,828 B2 | 5/2008 | Brandt | |
| 7,407,596 B2 | 8/2008 | Choi et al. | |
| 7,639,520 B1 | 12/2009 | Zansky et al. | |
| 8,497,677 B2 | 7/2013 | Miyahara | |
| 8,980,053 B2 | 3/2015 | Krahn et al. | |
| 9,106,125 B1 | 8/2015 | Brandt et al. | |
| 9,159,487 B2 | 10/2015 | Peck | |
| 2002/0163330 A1 | 11/2002 | Sekiya | |
| 2003/0117251 A1 | 6/2003 | Haugs et al. | |
| 2004/0027121 A1 | 2/2004 | Choi | |
| 2004/0051617 A1 | 3/2004 | Buswell | |
| 2004/0124958 A1 | 7/2004 | Watts et al. | |
| 2004/0135661 A1 | 7/2004 | Haugs et al. | |
| 2005/0035761 A1* | 2/2005 | Park et al. | 324/244 |
| 2005/0093669 A1 | 5/2005 | Ahn et al. | |
| 2006/0082430 A1 | 4/2006 | Sutardja | |
| 2006/0089022 A1 | 4/2006 | Sano | |
| 2006/0197480 A1 | 9/2006 | Mori et al. | |
| 2008/0150664 A1 | 6/2008 | Blankenship et al. | |
| 2008/0163475 A1 | 7/2008 | Snyder | |
| 2009/0244937 A1 | 10/2009 | Liu | |
| 2009/0289754 A1 | 11/2009 | Shpiro et al. | |
| 2010/0134044 A1 | 6/2010 | Sin | |
| 2010/0134058 A1 | 6/2010 | Nagashima et al. | |
| 2010/0164673 A1 | 7/2010 | Shim | |
| 2010/0194373 A1 | 8/2010 | Hamberger et al. | |
| 2011/0095858 A1 | 4/2011 | Spurny | |
| 2011/0163834 A1 | 7/2011 | Stahmann et al. | |
| 2011/0210722 A1 | 9/2011 | Paci | |
| 2011/0279212 A1 | 11/2011 | Ikriannikov et al. | |
| 2012/0150679 A1 | 6/2012 | Lazaris | |
| 2012/0226386 A1 | 9/2012 | Kulathu et al. | |
| 2012/0315792 A1 | 12/2012 | Costello | |
| 2013/0043725 A1 | 2/2013 | Birkelund | |
| 2013/0049751 A1 | 2/2013 | Hamberger et al. | |
| 2014/0022040 A1 | 1/2014 | Peck | |
| 2014/0210585 A1 | 7/2014 | Peck, Jr. | |
| 2014/0232384 A1 | 8/2014 | Peck, Jr. | |
| 2015/0043119 A1 | 2/2015 | Peck, Jr. | |

FOREIGN PATENT DOCUMENTS

| | | |
|---|---|---|
| CN | 1514258 A | 7/2004 |
| CN | 101995507 A | 3/2011 |
| DE | 2926423 A1 | 1/1981 |
| DE | 4129265 A1 | 3/1993 |
| EP | 1345036 A2 * | 9/2003 |
| EP | 2688076 A2 | 1/2014 |
| JP | 01242333 A | 9/1989 |
| JP | 02192705 A | 7/1990 |
| JP | H0977452 A | 3/1997 |
| JP | 2001167933 A | 6/2001 |
| JP | 2011238653 A | 11/2011 |
| WO | 2007078403 A2 | 7/2007 |
| WO | 2014130122 A1 | 8/2014 |

OTHER PUBLICATIONS

The Boeing Company; International Preliminary Report on Patentability for International Application No. PCT/US2013/072789 dated Aug. 25, 2015, 9 Pages.

Fedder, Gary K., et al.; "Laminated High-Aspect-Ratio Microstructures in a Conventional CMOS Process," Proceedings of the IEEE Micro Electro Mechanical Systems Workshop, 1996, pp. 13-18.

Chee, Clinton Y.K., et al.; "A Review on the Modelling of Piezoelectric Sensors and Actuators Incorporated in Intelligent Structures," Journal of Intelligent Material Systems and Structures, 1998, pp. 3-19, vol. 9.

Wilson, Earl J.; "Strain-Gage Instrumentation," Harris' Shock and Vibration Handbook, 2002, pp. 17.1-17.15, Chapter 17, 5th Edition.

Simoes Moita, Jose M., et al.; "Active control of adaptive laminated structures with bonded piezoelectric sensors and actuators," Computers and Structures, 2004, pp. 1349-1358, vol. 82.

European Patent Office; Extended European Search Report for European Application No. 14179801.7 dated Jul. 10, 2015, 14 pages.

European Patent Office; European Patent Application No. 14178702.8, European Search Report dated Jan. 21, 2015, 7 pages.

European Patent Office; Extended European Search Report for European Patent Application No. 13173067.3 dated Nov. 3, 2015, 9 Pages.

Chinese Patent Office; Office Action for Chinese Patent Application No. 2013800736555 dated Aug. 26, 2016, 16 Pages.

* cited by examiner

MAGNETIC CORE FLUX SENSOR

CROSS-REFERENCE TO RELATED APPLICATIONS

This application is related to U.S patent applicant Ser. No. 13/553,267, filed Jul. 19, 2012, now U.S. Pat. No. 9,159,487, entitled "Linear Electromagnetic Device" which is assigned to the same assignee as the present application.

FIELD

The present disclosure relates to electromagnetic devices, such as electrical transformers and inductors, and more particularly to a magnetic core flux sensor and method for measuring magnetic flux within a core of a transformer, inductor or similar device.

BACKGROUND

Electromagnetic devices, such as inductors, transformers and similar devices include magnetic cores in which a magnetic flux flow may be generated in response to an electrical current flowing through a conductor winding associated with the magnetic core. The magnetic flux flow in a magnetic core may be estimated using techniques such as finite element analysis or similar techniques; however such methods are not a direct method of measuring the flux in a core. Accordingly, magnetic cores may be overdesigned or may be made larger than necessary for some applications. This can result in excess weight and volume of such devices. The excess weight and volume can be an important consideration when these electromagnetic devices are used in certain applications, such as for example on vehicles such as aircraft, aerospace vehicles or other vehicles where weight and size may be important.

An understanding of the flow or pattern of saturation in a magnetic core may also be helpful information in designing such electromagnetic devices. Whether a particular core design saturates as one body or if the saturation is time-based may be useful. For example, at any one moment in time, there is a boundary in the core material where the material may be saturated on one side of the boundary and non-saturated on the other side of the boundary. Knowledge of the saturation pattern may directly affect the design and implementation of magnetic components and such understanding may best be obtained by directly measuring the magnetic flux in the core. Accordingly, there is a need for being able to directly measure the flux within the core component of an electromagnetic device, such as an inductor, transformer or similar device.

SUMMARY

In accordance with an embodiment, a magnetic core flux sensor assembly may include a flux sensor core portion and at least one elongated opening for receiving a conductor winding through the flux sensor core portion. An electrical current flowing through the conductor winding generates a magnetic field about the conductor winding and a magnetic flux flow about the at least one elongated opening in the flux sensor core portion. A plurality of pairs of sensor holes are positioned relative to the at least one elongated opening for preventing significant disruption of the magnetic flux flow in the sensor core portion and for use in sensing the magnetic flux flow at different distances from an edge of the at least one elongated opening. The magnetic core flux sensor assembly may also include a sensor conductor winding through each pair of sensor holes. The magnetic flux flow generates an electrical signal in each sensor conductor winding and the electrical signal in a particular sensor conductor winding corresponds to the magnetic flux flow at a location of the particular sensor conductor winding.

In accordance with another embodiment, electromagnetic device may include a flux sensor core portion and at least one elongated opening for receiving a conductor winding through the flux sensor core portion. An electrical current flowing through the conductor winding generates a magnetic field about the conductor winding and a magnetic flux flow about the at least one elongated opening in the flux sensor core portion. A plurality of pairs of sensor holes are positioned relative to the at least one elongated opening for preventing significant disruption of the magnetic flux flow in the sensor core portion and for use in sensing the magnetic flux flow at different distances from an edge of the at least one elongated opening. The electromagnetic device may also include a sensor conductor winding through each pair of sensor holes. The magnetic flux flow generates an electrical signal in each sensor conductor winding and the electrical signal in a particular sensor conductor winding corresponds to the magnetic flux flow at a location of the particular sensor conductor winding. A spacer portion may be disposed on opposite sides of the flux sensor core. The spacer portion may include an opening for the conductor winding to pass through the spacer portion. The electromagnetic device may further include a magnetic core portion disposed on each spacer portion. The at least one elongated opening extends through the magnetic core portion and the conductor winding extends through each magnetic core portion. The spacer portion may also include a gap for the sensor conductor winding through each pair of sensor holes to connect to a device for detecting the magnetic flux flow at the location of each sensor conductor winding.

In accordance with another embodiment, a magnetic core flux sensor assembly may include a flux sensor core portion and at least one elongated opening for receiving a conductor winding through the flux sensor core portion. An electrical current flowing through the conductor winding generates a magnetic field about the conductor winding and a magnetic flux flow about the at least one elongated opening in the flux sensor core portion. The magnetic core flux sensor assembly may also include plurality of sensor holes. Each sensor hole may be positioned relative to the at least one elongated opening for preventing significant disruption of the magnetic flux flow in the sensor core portion and for use in sensing the magnetic flux flow at different distances from an edge of the at least one elongated opening. A sensor conductor wire extends through each sensor hole. The magnetic flux flow generates an electrical signal in each sensor conductor wire and the electrical signal in a particular sensor conductor wire corresponds to the magnetic flux flow at a location of the particular sensor conductor wire.

In accordance with further embodiment, a method for measuring a magnetic flux in an electromagnetic device may include providing a magnetic core flux sensor assembly including a flux sensor core portion and at least one elongated opening for receiving a conductor winding through the flux sensor core portion. An electrical current flowing through the conductor winding generates a magnetic field about the conductor winding and a magnetic flux flow about the at least one elongated opening in the flux sensor core portion. The method may also include providing a plurality of pairs of sensor holes positioned relative to the at least one elongated opening for preventing significant disruption of the magnetic flux flow in the sensor core portion and for use in sensing the magnetic flux flow at different distances from an edge of the at least one elongated opening. The method may further include providing a sensor conductor winding through each pair of sensor holes. The magnetic flux flow generates an electrical signal in each sensor conductor winding. The electrical signal in a particular sensor conductor winding corresponds to the magnetic flux flow at a location of the particular sensor conductor winding.

BRIEF DESCRIPTION OF THE SEVERAL VIEWS OF DRAWINGS

The following detailed description of embodiments refers to the accompanying drawings, which illustrate specific embodiments of the disclosure. Other embodiments having different structures and operations do not depart from the scope of the present disclosure.

DESCRIPTION

Figure 1:
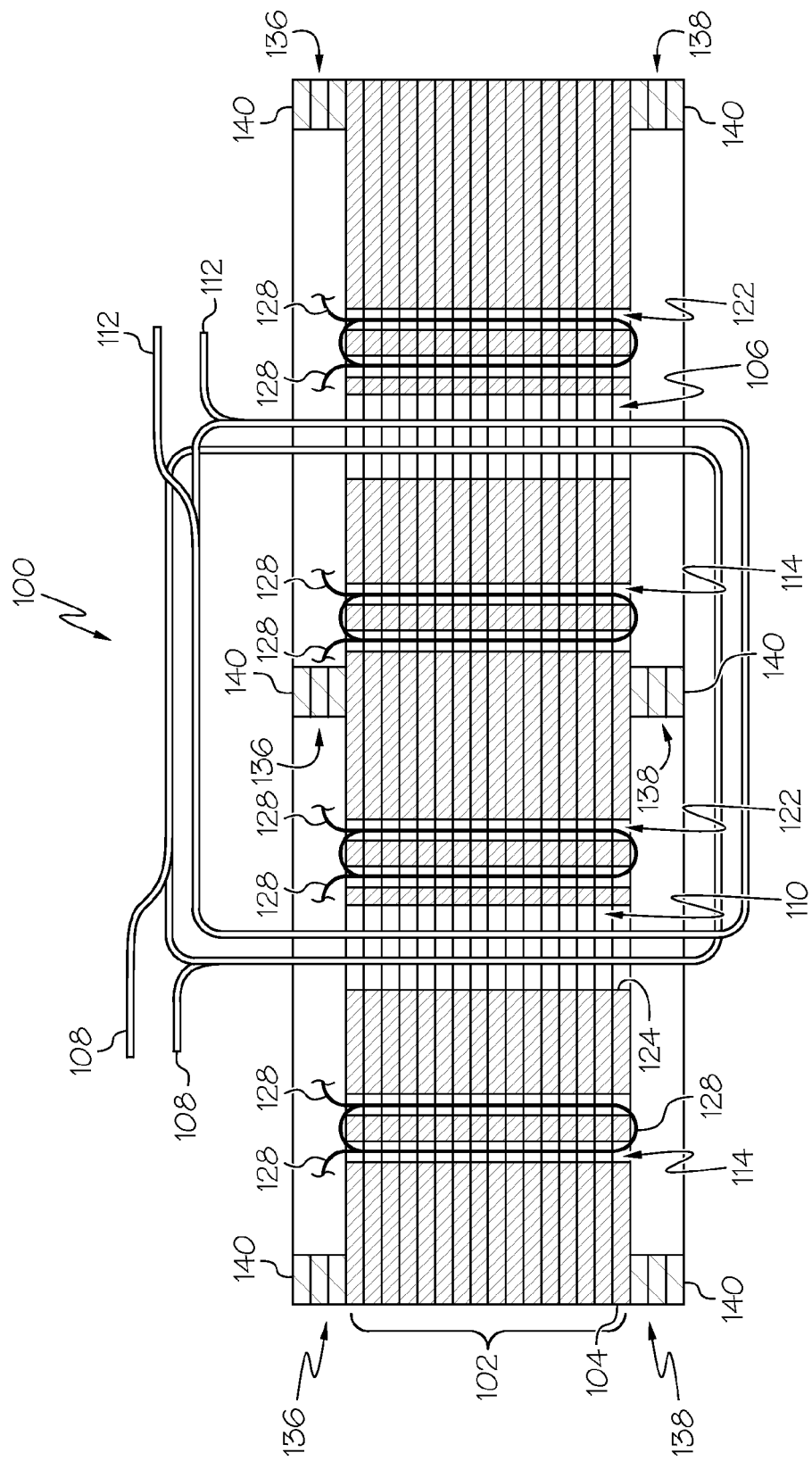
FIG. 1 is a side cross-sectional view of an example of a magnetic core flux sensor assembly in accordance with an embodiment of the present disclosure.

The following detailed description of embodiments refers to the accompanying drawings, which illustrate specific embodiments of the disclosure. Other embodiments having different structures and operations do not depart from the scope of the present disclosure. Like reference numerals may refer to the same element or component in the different drawings.

In accordance with an embodiment of the present disclosure, a linear inductor is an electromagnetic device having only one electrical conductor wire winding or windings passing through a magnetic core. In accordance with another embodiment, a linear transformer is a magnetic device where a linear primary electrical conductor wire winding or windings and one or more linear secondary electrical conductors wire winding or windings pass through a magnetic core. The core may be one piece and no turns of the primary and secondary electrical conductors about the core are required. While the core may be one piece, the one piece core may be formed from a plurality of stacked plates or laminates. A current may be conducted through the primary. A magnetic flux from the current in the primary is absorbed by the core. When the current in the primary decreases the core transmits an electromotive force (desorbs) into the secondary wires. A feature of the linear transformer is the linear pass of the primary and secondary conductors through the core. One core may be used as a standalone device or a series of two or more cores may be used where a longer linear exposure is required. Another feature of this transformer is that the entire magnetic field or at least a substantial portion of the magnetic field generated by the current in the primary is absorbed by the core, and desorbed into the secondary. The core of the transformer may be sized or include dimensions so that substantially the entire magnetic field generated by the current is absorbed by the core and so that the magnetic flux is substantially completely contained with the core. This forms a highly efficient transformer with very low copper losses, high efficiency energy transfer, low thermal emission and very low radiated emissions. Additionally the linear transformer is a minimum of 50% lower in volume and weight then existing configurations. Linear electromagnetic devices, such as linear transformers, inductors and similar devices are described in more detail in U.S. patent application Ser. No. 13/553,267, filed Jul. 19, 2012, now U.S. Pat. No. 9,159,487, entitled "Linear Electromagnetic Device" which is assigned to the same assignee as the present application and is incorporated herein in its entirety by reference. A magnetic core flux sensor assembly, as described herein, may be incorporated in a linear electromagnetic device, such as one of those described in the U.S. patent application Ser. No. 13/553,267, for directly detecting and measuring the magnetic flux flow within a magnetic core of such devices or magnetic core flux sensor assembly component of such devices.

Figure 2A:
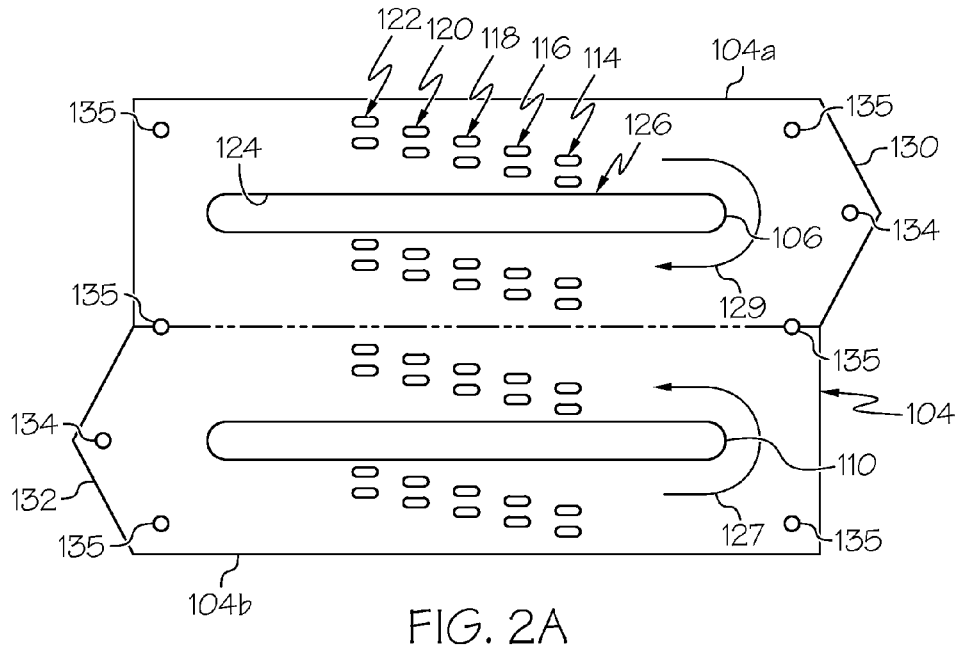
FIG. 2A is a top view of an example of a magnetic flux sensor plate or laminate in accordance with an embodiment of the present disclosure.
Figure 2B:
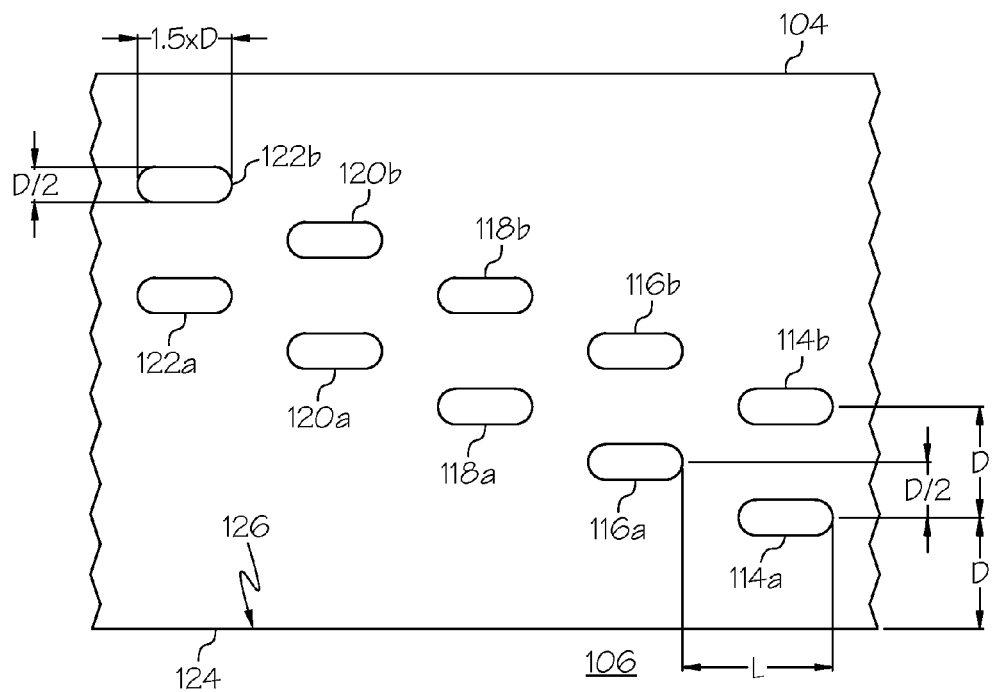
FIG. 2B is a partial view of the exemplary magnetic flux sensor plate or laminate of FIG. 2A showing a detail of the sensor holes in accordance with an embodiment of the present disclosure.

FIG. 1 is a cross-sectional view of an example of a magnetic core flux sensor assembly 100 in accordance with an embodiment of the present disclosure. The magnetic core flux sensor assembly 100 may include a flux sensor core portion 102. The flux sensor core portion 102 may include a plurality of flux sensor core plates 104 or laminates that are stacked on one another. Referring also to FIG. 2A, FIG. 2A is a top view of an example of a magnetic flux sensor plate 104 or laminate in accordance with an embodiment of the present disclosure. FIG. 2B is a partial view of the exemplary magnetic flux sensor plate 104 or laminate of FIG. 2A showing a detail of the sensor holes 114-122 in each sensor plate 104 in accordance with an embodiment of the present disclosure. The plates 104 may be made from a material capable of absorbing a magnetic flux. For example, the plates 104 may be made from silicon steel alloy, a nickel-iron alloy or other metallic material capable of absorbing a magnetic flux similar to that described herein. In an embodiment, the core 102 may be a nickel-iron alloy including about 20% by weight iron and about 80% by weight nickel. The plates 104 may be substantially square or rectangular, or may be some other geometric shape depending on the application of the electromagnetic device and the environment where the electromagnetic device may be located.

The magnetic core flux sensor assembly 100 may also include at least one elongated opening 106 or winding opening for receiving a conductor winding 108 or windings through the flux sensor core portion 102. The exemplary magnetic core flux sensor assembly 100 in FIG. 1 and the flux sensor plate 104 in FIG. 2A may be configured for use in a transformer type electromagnetic device or an inductor type electromagnetic device. An example of a transformer electromagnetic device will be described with reference to FIG. 4. In the example of FIG. 4, the magnetic core flux sensor assembly 100 and flux sensor plate 104 each include a second elongated opening 110. Each of the elongated openings 106 and 110 may receive a primary conductor winding 108 or windings and at least a secondary conductor winding 112 or windings through the flux sensor core portion 102. In another embodiment, the transformer may have more than two windings. In such an embodiment or embodiments. all windings may pass through both elongated openings 106 and 110. If the transformer windings are of unequal turns, each winding will have a unique number of passes through each elongated opening 106 and 110.

The core flux sensor assembly 100 may also be used in an inductor type electromagnetic device. In an inductor configuration, only one electrical conductor winding will pass through both elongated openings 106 and 110. It should be noted that all magnetic core configurations described herein may be an inductor or transformer. The number and use of the windings determines whether the device is an inductor or transformer.

Figure 6A:
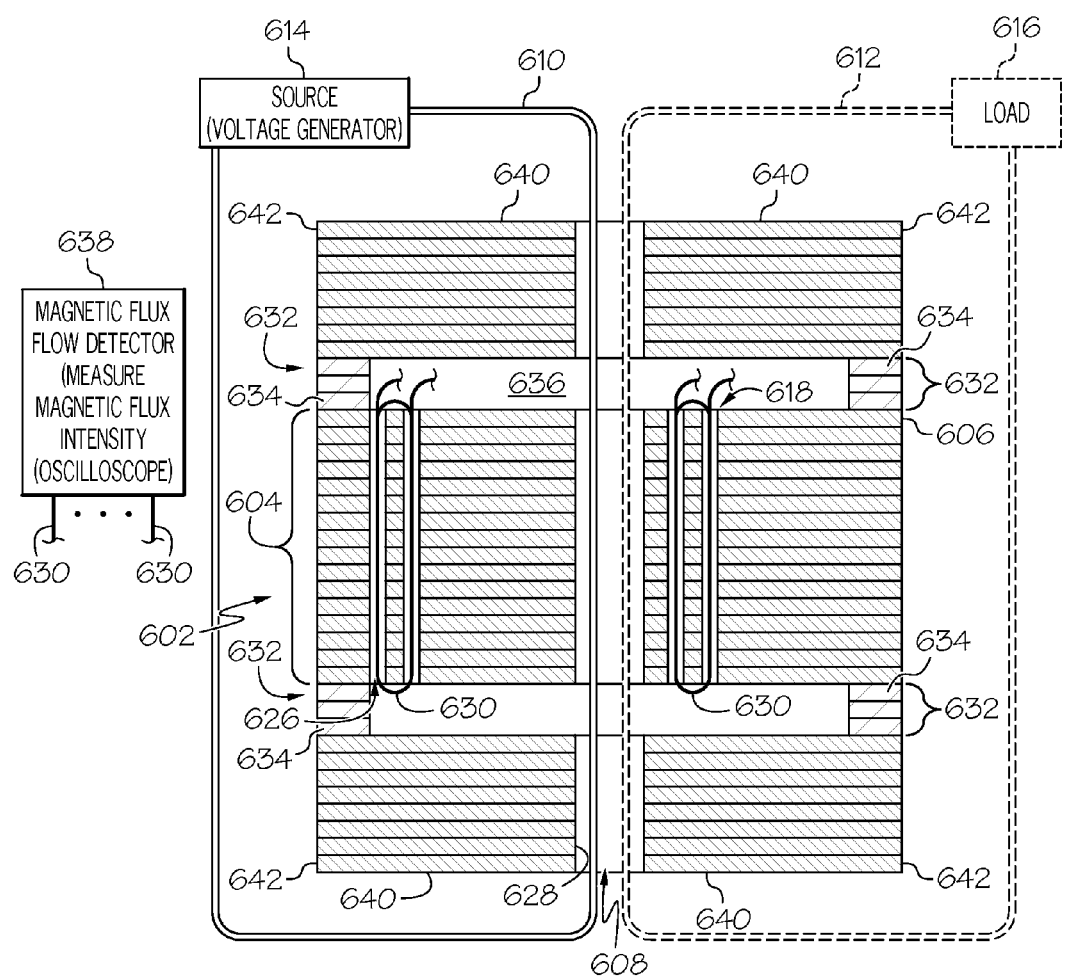
FIG. 6A is a cross-sectional view of an example of an inductor or transformer assembly depending upon the number of windings including a magnetic flux sensor in accordance with an embodiment of the present disclosure.
Figure 6B:
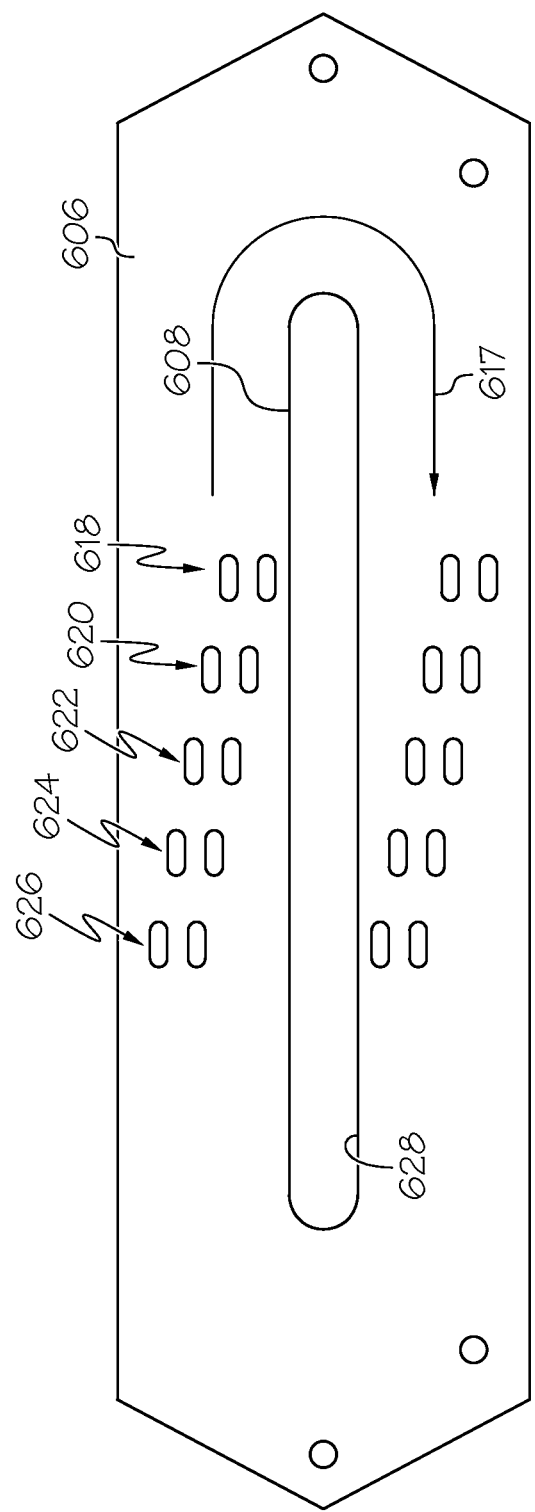
FIG. 6B is a top view of an example of a magnetic flux sensor plate or laminate in accordance with another embodiment of the present disclosure.

A magnetic core flux sensor assembly similar to the magnetic core flux sensor assembly 100 may also be configured with a single elongated opening such as that illustrated in FIGS. 6A and 6B. A magnetic core flux sensor assembly with a single elongated opening or at least one elongated opening may be used with an inductor type electromagnetic device which has only a single conductor winding, or in a transformer type configuration where both primary windings and at least one second windings which may be adjacent one another in the same elongated opening similar to that described in U.S. patent application Ser. No. 13/553,267.

An electrical current flowing through the conductor winding 108 or windings generates a magnetic field around the conductor or conductors 108 and a magnetic flux is absorbed by the core portion 102 and flows about the at least one elongated opening 106 in the core of the flux sensor core portion 102. In the transformer configuration, as illustrated in FIG. 1, a magnetic flux is absorbed in the core portion 102 and flows in the core of the flux sensor core portion 102 around the second elongated opening 110.

The magnetic core flux sensor assembly 100 also includes a plurality of pairs of flux sensor holes 114-122. The pairs of flux sensor holes 114-122 are placed in the flux sensor core portion 102 to support sensor conductors 128 or loop antenna sensors as described in more detail below. The loop antenna sensors are distributed in the flux sensor core portion 102 to detect the magnetic flux density in the core and the loop antenna sensors are distributed at predefined distances from the elongated winding opening 106 and in a distribution pattern that least affects the flow of magnetic flux in the core. Hence, the pairs of flux sensor holes 114-122 are positioned relative to the at least one elongated opening 106 for preventing significant disruption of the magnetic flux flow in the sensor core portion 102. The plurality of pairs of sensor holes 114-122 are also positioned for use in sensing the magnetic flux flow at different distances from an edge 124 of the at least one elongated opening 106. In the exemplary transformer configuration illustrated in FIGS. 1 and 2A, the plurality of sensor holes 114-122 are disposed along both longitudinal sides or longer dimensional sides of the elongated openings 106 and 110. However, in another embodiment, the plurality of pairs of sensor holes 114-122 may be disposed only along one longitudinal side 126 of the elongated opening 106. In some embodiments there may be only one elongated opening as in the magnetic flux sensor assembly illustrated in FIGS. 6A and 6B.

In the exemplary flux sensor plate 104 illustrated in FIGS. 2A and 2B, only five pairs of sensor holes 114-122 are shown; however, a magnetic flux sensor core portion may include any number of pairs of sensor holes depending upon the size of the electromagnetic device in which the flux sensor is to be used and the number of locations in the core where flux measurements may be desired. However, there may be constraints as to the size, number and placement of the sensor holes so as to minimize or avoid disruption of the magnetic flux flow in the flux sensor core portion.

Referring also to FIG. 2B, FIG. 2B is a partial view of the exemplary magnetic flux sensor plate 102 or laminate of FIG. 2A showing a detail of the sensor holes 114-122 in accordance with an embodiment of the present disclosure. The plurality of pairs of sensor holes 114-122 are each consecutively spaced along a longitudinal side 126 of the elongated opening 106 and with each consecutive pair of sensor holes 114-122 being positioned at an increasing distance from the edge 124 of the longitudinal side 126 of the elongated opening 106. The plurality of consecutive pairs of sensor holes 114-122 may be spaced uniformly at a predetermined distance "L" from one another along the longitudinal side 126 of the at least one elongated opening 106. The first sensor hole 114a-122a of each pair of sensor holes 114-122 are closer to the longitudinal side 126 or edge 124 of the elongated opening 106 than a second sensor hole 114b-122b of each pair of sensor holes 114. The first and second sensor holes of each pair of sensor holes 114-122 may be the same distance apart with the first sensor hole being parallel to the second sensor hole and both holes being parallel to the longitudinal side 126 of the elongated opening 106. A centerline of a first sensor hole 114a of a first pair of sensor holes 114 may be at a selected a distance "D" from the edge 124 of the elongated opening 106. A distance of a centerline of the first sensor hole 114a-122a of each consecutive pair of sensor holes 116-122 may increase in distance from the edge 124 of the elongated opening 106 by about half the selected distance "D" or by "D/2". Accordingly, a centerline of the first sensor hole 116a of the second pair of sensor holes 116 may be a distance "D/2" from a centerline of the first sensor hole 114a of the first pair of sensor holes 114 and each successive first sensor hole 118a-122a will be about the distance D/2 from the first sensor hole of the adjacent pair of sensor holes and the distance D/2 farther from the edge 124 of the elongated opening 106.

Each of the sensor holes 114-122 may be an elongated opening similar to that illustrated in FIG. 2B for receiving a sensor conductor winding 128 or windings (FIG. 1). For example, each sensor hole may have a width of about D/2 and a length of about 1.5 D.

A sensor conductor winding 128, windings or loop antenna sensors may be wound or passed through each pair of sensor holes 114-122. The magnetic flux flow generates an electrical signal in each sensor conductor 128. The electrical signal in a particular sensor conductor winding 128 corresponds to the magnetic flux flow at a location of the particular sensor conductor winding and pair of sensor holes 114-122. The sensor holes 114-122 and sensor windings 128 or loop antenna sensors are distributed in the core 104 to detect magnetic flux density at predefined distances from each elongated opening 106 and 110. The sensor holes 114-122 and sensor windings 128 are also placed in a distribution pattern that least affects the flow of magnetic flux as illustrated by arrows 127 and 129 in FIG. 2A. The magnetic flux flow in the cores 104a and 104b will be in opposite directions as illustrated by arrows 127 and 129 about the respective elongated openings 106 and 110 because of the direction of electric current flow in the windings 108 (FIG. 1) through the elongated openings 106 and 110 and the right-hand rule. Based on the right-hand rule, electric current flowing into the page in windings through elongated opening 106 will cause a magnetic flux flow in the direction of arrow 129 in the example in FIG. 2A, and electric current flowing out of the page in the same windings through elongated opening 110 will cause a magnetic flux flow in the direction of arrow 127.

In accordance with another embodiment, rather than a plurality of pairs of sensor holes 114-122, there may be a plurality of single sensor holes. Each sensor hole may be positioned relative to the at least one elongated opening 106 and 110 for preventing significant disruption of the magnetic flux flow in the sensor core portion 104 and for use in sensing the magnetic flux flow at different distances from an edge 124 of the at least one elongated opening 106 and 110. The sensor conductor winding 128 may be a single wire or antenna element in each single sensor hole. The single sensor holes may be substantially circular or round or may be shaped to accommodate a size and shape of the single wire or antenna element.

As previously discussed, the flux sensor core portion 102 may include a plurality of flux sensor core plates 104 (FIG. 2A) stacked on one another (FIG. 1). The at least one elongated opening 106 and the plurality of pairs of sensor holes 114-122 are formed in each flux sensor core plate 104. As shown in FIG. 2A, each flux sensor core plate 104 may include a first plate portion 104a and a second plate portion 104b. The first elongated opening 106 may be formed in the first plate portion 104A and the second elongated opening 110 may be formed in the second plate portion 104b. A plurality of pairs of sensor holes 114-122 may be formed on both sides of the elongated openings 106 and 110 as shown in the embodiment of FIG. 2A.

The first plate portion 104a may include an extension member 130 extending from one end of the first plate portion 104a and the second plate portion 104b may include another extension member 132 extending from an end of the second plate portion 104b opposite the extension member 130 of the first plate portion 104a. A hole 134 may be formed and each of the extension members 130 and 132 for receipt of a holding device, such as a fastener, for holding the flux sensor core plates 104 together in the stack with the elongated openings 106 and 110 and the plurality of sensor holes 114-122 of each of the sensor core plates 104 in the stack in alignment with one another. Other holes 135 may also be formed in the flux sensor core plates 104 for receipt of additional holding devices or fasteners.

Figure 3:
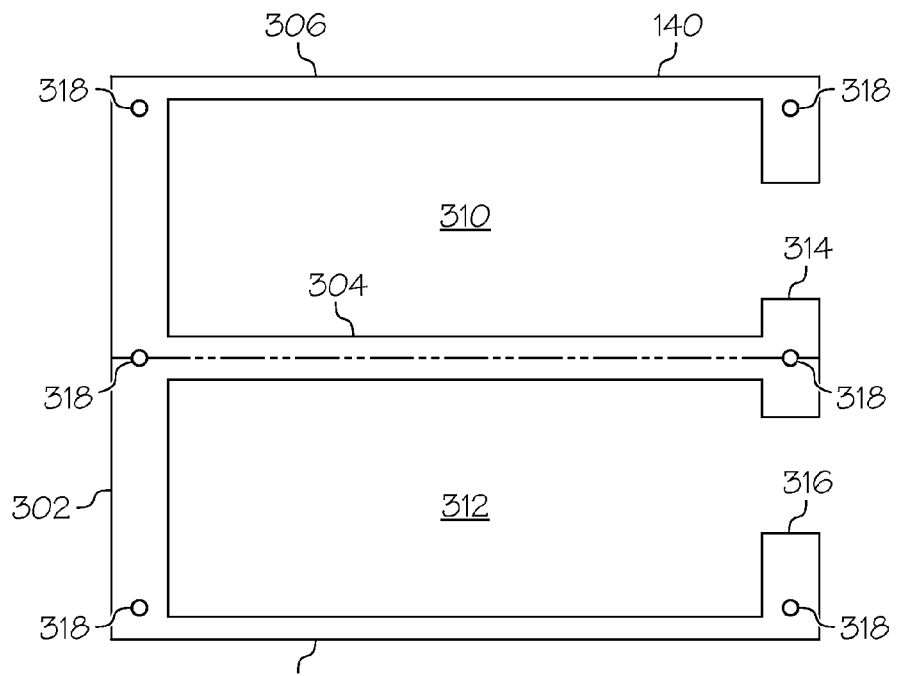
FIG. 3 is a top view of an example of a spacer plate or laminate in accordance with an embodiment of the present disclosure.

The magnetic core flux sensor assembly 100 may also include a spacer portion 136 and 138 disposed on each outside flux sensor core plate 104. Each spacer portion 136 and 138 may include a plurality of spacer plates 140 stacked on one another. The spacer plates may be made from a non-magnetic material or material that is an electrical insulator or dielectric. Referring also to FIG. 3, FIG. 3 is a top view of an example of a spacer plate 140 or laminate in accordance with an embodiment of the present disclosure.

The spacer plate 140 may be substantially "E" shaped as illustrated in FIG. 3. The spacer plate 140 may include a main segment 302, a center segment 304 extending from a central portion of the main member 302 and two outer segments 306 and 308 extending from opposite ends of the main segment 302. A plurality of spacer plates 140 stacked to form the spacer portions 136 and 138 provide openings 310 and 312 formed between the two outer segments 306 and 308 and the center segment 304 as in the embodiment illustrated in FIG. 3. The primary conductor windings 108 and secondary conductor windings 112 pass or extend through the openings 310 and 312 as illustrated by the broken lines and FIG. 1. In accordance with another embodiment, such as the exemplary inductor configuration illustrated in FIG. 6A, the spacer plate 140 may only have a single opening through which a conductor winding passes or extends as illustrated in FIG. 6A.

Each spacer plate 140 may also include a gap or gaps 314 and 316 for the sensor conductor windings 128 that pass through each pair of sensor holes 114-122 (FIG. 2A) to connect to a device (shown in FIG. 4) for detecting the magnetic flux flow at the location of each sensor conductor winding 128 and associated pair of sensor holes 114-122. Each spacer plate 140 may also include holes 318 which will align with holes 134 and 135 in the flux sensor core plates 130 to receive holding devices or fasteners for holding the components of the magnetic core flux sensor assembly 100 together.

Figure 4A:
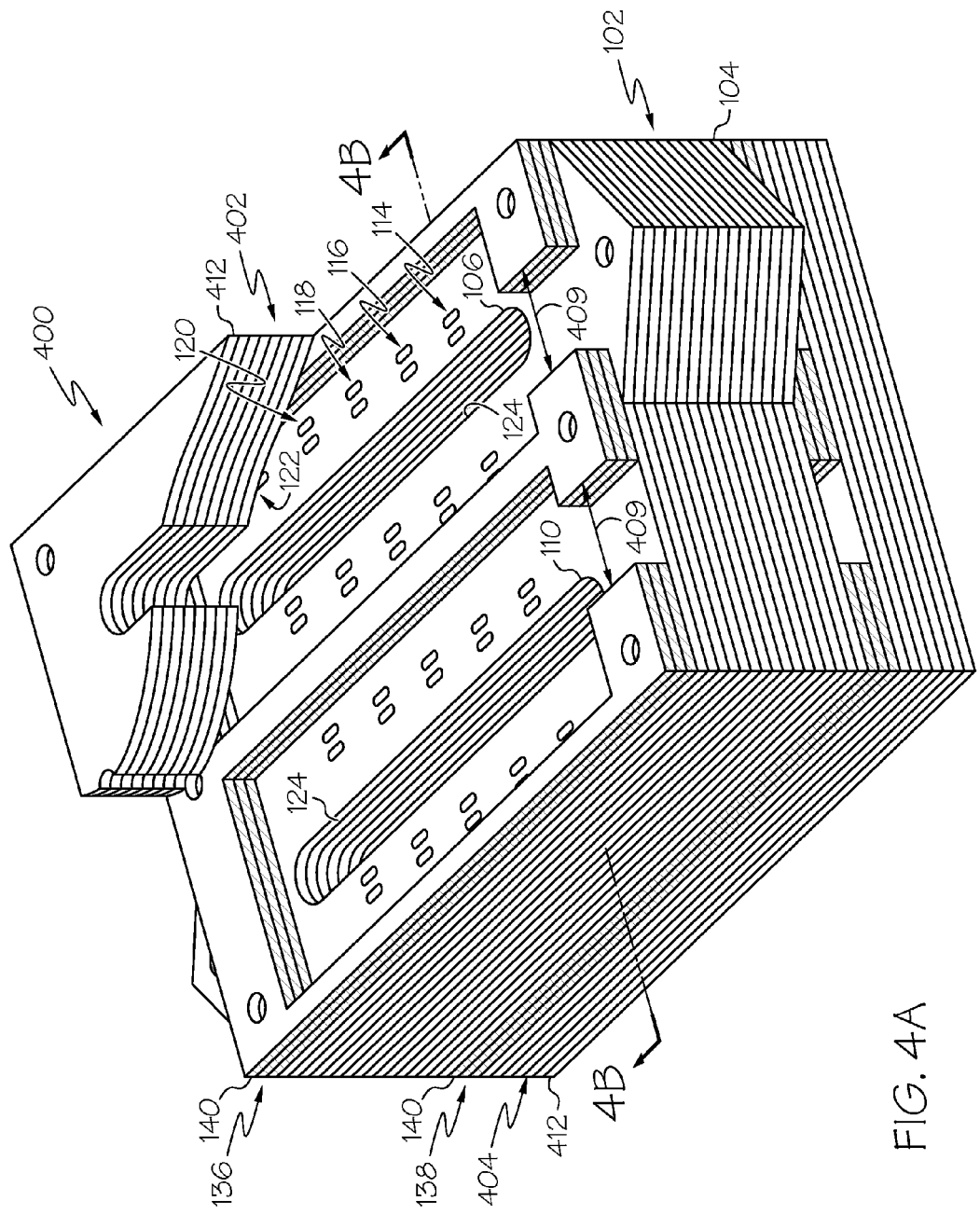
FIG. 4A is a perspective view of an example of a transformer assembly with a portion of the upper magnetic core cut-away to show an exemplary core flux portion sensor assembly in accordance with an embodiment of the present disclosure.
Figure 4B:
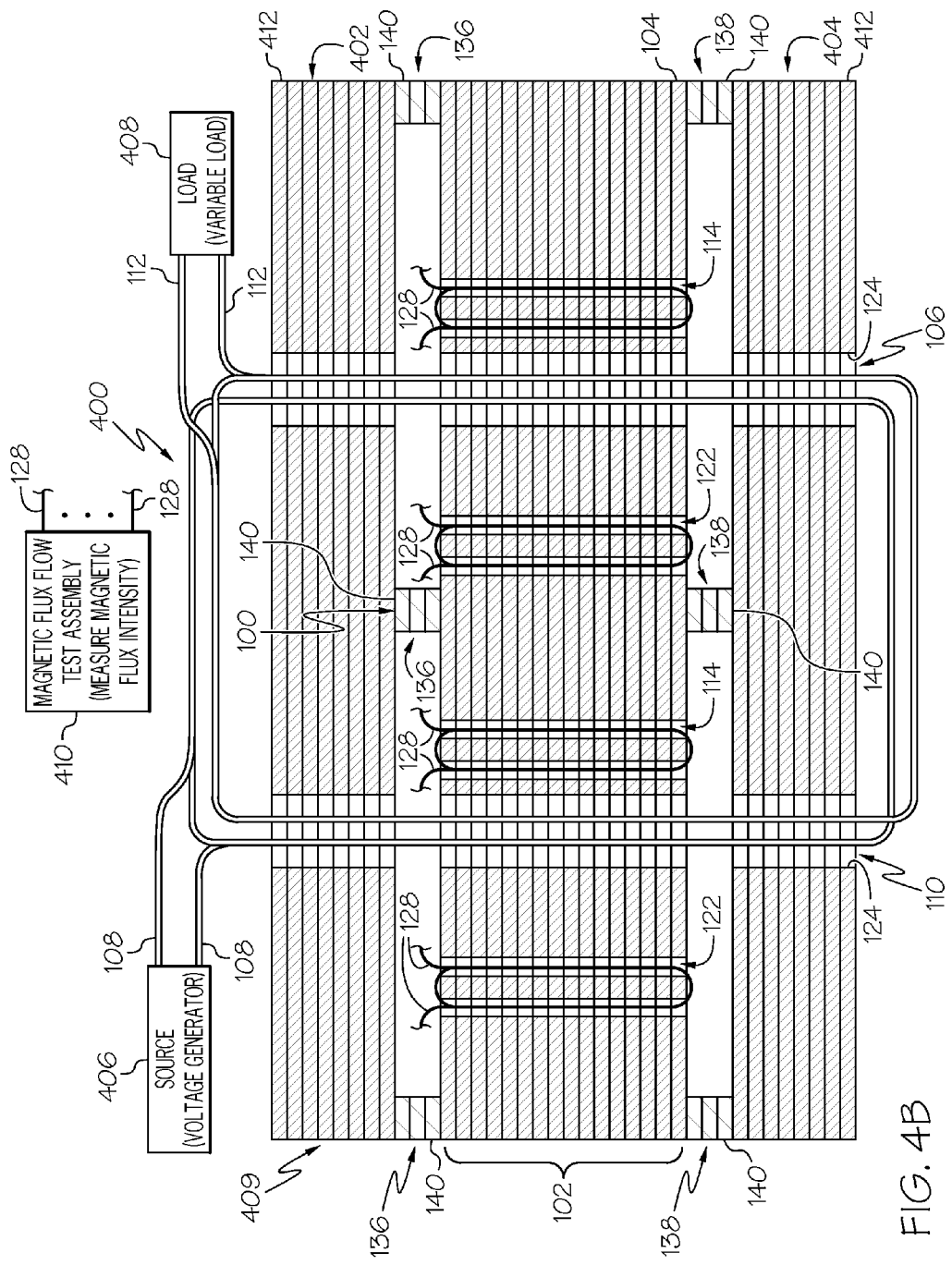
FIG. 4B is a side cross-sectional view taken along lines 4A-4A of the exemplary transformer assembly of FIG. 4A.

FIG. 4A is a perspective view of an example of a transformer assembly 400 with a portion of the upper magnetic core portion 402 cut-away to show an exemplary core flux portion sensor assembly in accordance with an embodiment of the present disclosure. The exemplary core flux portion sensor assembly shown in FIG. 4A is the same as the magnetic core flux sensor assembly 100 of FIG. 1 although other configurations may also be used. FIG. 4B is a side cross-sectional view taken along lines 4A-4A of the exemplary transformer assembly 400 of FIG. 4A. The transformer assembly 400 includes a magnetic core portion 402 and 404 respectively disposed on each spacer portion 136 and 138. The elongated openings 106 and 110 extend through each magnetic core portion 402 and 404 and the primary and secondary conductor windings 108 and 112 extend or pass through each magnetic core portion 402 and 404. The primary conductor windings 108 may connect to a source 406 of electrical power and the secondary conductor windings 112 may connect to a load 408 which may be a variable load. The electrical source 406 may be a voltage generator or other device for conducting an electrical current through the conductor windings 108 to generate a magnetic field about the primary conductor windings 108 and a magnetic flux flow about the elongated openings 106 and 110 extending through the magnetic flux sensor assembly 100 and the core portions 402 and 404. As previously discussed, the assembly 400 may include more than two windings 108 and 112 and may also be configured as an inductor if only one winding passes through both elongated openings 106 and 110.

Similar to that previously discussed, at least the spacer portion 136 may include a gap 409 formed by gaps 314 and 316 in spacer plates 140 for the sensor conductor windings 128 to connect to a magnetic flux flow test assembly 410. The magnetic flux flow test assembly 410 may include a device for detecting and/or measuring the magnetic flux flow at the location of each sensor conductor winding 128 for sensor holes 114-122. The magnetic flux flow test assembly 410 or device may include or may be an oscilloscope for displaying the electrical signal in each particular sensor conductor winding 128 which corresponds to the magnetic flux flow at a location of the particular sensor conductor winding 128 in the sensor holes 114-122.

Figure 5:
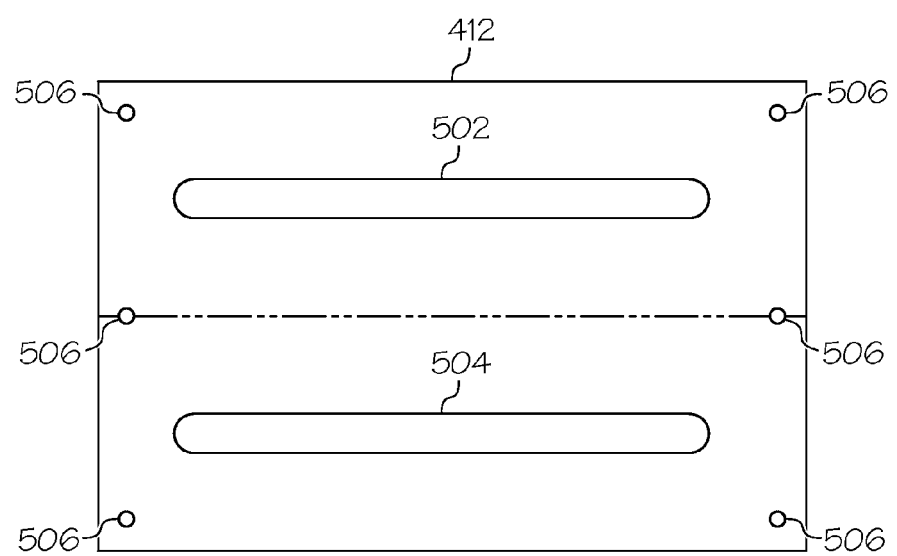
FIG. 5 is a top view of an example of a magnetic core plate or laminate in accordance with an embodiment of the present disclosure.

Each magnetic core portion 402 and 404 may include a plurality of magnetic core plates 412 or laminates stacked on one another as illustrated in the exemplary embodiment in FIG. 4. The plates 412 may be made from the same material as the sensor plates 104 that is capable of absorbing a magnetic flux as described herein. Referring also to FIG. 5, FIG. 5 is a top view of an example of a magnetic core plate 412 or laminate in accordance with an embodiment of the present disclosure. The exemplary magnetic core plate 412 illustrated and FIG. 5 may be used in a transformer type configuration or assembly, such as the exemplary transformer assembly 400 illustrated and FIG. 4. The magnetic core plate 412 includes a first elongated opening 502 and a second elongated opening 504. The second elongated opening 504 may be parallel to the first elongated opening 502 to permit the conductor winding or windings 108 and 122 to pass through the stacked magnetic core plates 412 forming the magnetic core portions 402 and 404.

Each magnetic core plate 412 may also include a plurality of holes 506 which align with the openings 310 in the spacer plates 140 and openings 134 and 135 in the flux sensor core plates 104 assembling the transformer 400.

FIG. 6A is a cross-sectional view of an example of an electromagnetic device 600 including a magnetic flux sensor assembly 602 in accordance with an embodiment of the present disclosure. The exemplary electromagnetic device may be an inductor assembly if there is only a single conductor winding, or a transformer assembly if primary and secondary conductor windings are provided. A secondary conductor 612 and load 616 are shown in phantom or dashed lines in FIG. 6A to illustrate an example of a transformer configuration. The magnetic core flux sensor assembly 602 may be similar to the magnetic core flux sensor assembly 100 described with reference to FIG. 1; however, the electromagnetic device 600 may include a single opening for conductor windings. Accordingly, the electromagnetic device 600 may include a flux sensor core portion 604. Similar to that previously described, the flux sensor core portion 604 may include a plurality of flux sensor plates 606 or laminates stacked on one another as shown in FIG. 6A. Referring also to FIG. 6B, FIG. 6B is a top view of an example of a flux sensor plate 606 or laminate for use with the magnetic core flux sensor assembly 602 in accordance with an embodiment of the present disclosure. The electromagnetic device 600 may include at least one elongated opening 608 through the flux sensor core portion 604 and through other components of the electromagnetic device 600 for receiving a conductor winding 610 or windings. As previously described, the electromagnetic device 600 may be an inductor assembly with only a single conductor winding 610 or windings, or may include at least one secondary winding 612 in a transformer configuration in which configuration the winding 610 may be a primary winding. Both primary and secondary windings 610 and 612 may pass through the same elongated opening 608 but may be spatially separated or insulated from one another similar to that described in U.S. patent application Ser. No. 13/553, 267. The windings 610 may be connected to an electrical source 614. The electrical source may be a voltage generator or other source of electrical power. If the electromagnetic device 600 is a transformer and includes secondary windings 612, the secondary windings 612 may be connected to a load 616. The electrical current flowing through the conductor winding 610 or windings generates a magnetic field about the conductor winding 610 and the magnetic field generates a magnetic flux flow (illustrated by arrow 617 in FIG. 2B 6B) about the at least one elongated opening 608 in the flux sensor core portion 604 and other core portions of the electromagnetic device 600.

Each flux sensor plate 606 of the flux sensor core portion 602 may also include a plurality of pairs of sensor holes 618-626 positioned relative to the at least one elongated opening 608. The plurality of pairs of sensor holes 618-626 are positioned for preventing significant disruption of the magnetic flux flow in the sensor core portion 602 and for use in sensing the magnetic flux flow at different distances from an edge 628 of the at least one elongated opening 608. The plurality of pairs of sensor holes 618-626 may be positioned similar to the sensor holes 114-122 described with reference to FIGS. 2A and 2B. The plurality of pairs of sensor holes 618-626 may be disposed on both longitudinal sides of the elongated opening 608 as shown in FIG. 6B, or in another embodiment, the plurality of pairs of sensor holes 618-626 may be disposed only on one longitudinal side of the elongated opening 608. Accordingly, the sensor holes are positioned to support sensor conductor windings 630 or loop antenna sensors distributed in the sensor core portion 602 to detect magnetic flux density at predefined distances from the elongated opening 608. The distribution pattern of the sensor holes 618-626 and loop antenna sensors is to least affect the flow of magnetic flux in the laminate or core 602.

A sensor conductor winding 630 or loop antenna sensors may pass or extend through each pair of sensor holes 618-626. The magnetic flux flow in the flux sensor core 604 generates an electrical signal in each sensor conductor winding 630. The electrical signal in a particular sensor conductor winding 630 corresponds to the magnetic flux flow at a location of the particular sensor conductor winding 630 or associated sensor holes 618-626.

A spacer portion 632 may be disposed on opposite sides of the flux sensor core 604. Each spacer portion 632 may include a plurality of spacer plates 634 or laminates similar to the spacer plate 140 described with reference to FIG. 3 except the spacer plate 634 may be substantially C-shaped and may include only a single opening 636 similar to the opening 310 or 312 in FIG. 3. The conductor winding 610 passes through the opening 636 in the spacer portion 632 similar that illustrated in FIG. 6A. Each spacer plate 634 may also include a gap similar to the gap 314 or 316 in the spacer plate 140 (FIG. 3) that provide a gap 636 or opening for the sensor windings 630 through each pair of sensor holes 618-626 to connect to a magnetic flux flow detector 638. The magnetic flux flow detector 638 may measure the magnetic flux intensity at each of the locations of the sensor conductor windings 630 through sensor holes 618-626. Similar to that previously described, the magnetic flux flow and the detector 638 may be an oscilloscope for displaying a waveform of the electrical signal on each sensor conductor winding 630 which corresponds to the magnetic flux flow at the location of each particular sensor conductor winding passing through the sensor holes 618-626.

The electromagnetic device 600 may also include a magnetic core portion 640 disposed on each spacer portion 632. The at least one elongated opening 628 extends through the magnetic core portion 640 and the conductor winding 610 extends through each magnetic core portion 640. The magnetic core portion 640 may be made from a stack of magnetic core plates 642 similar to that previously described. Each magnetic core plate 642 or laminate may be similar to the magnetic core plate 412 in FIG. 5 except with a single elongated opening, such as opening 502, for receipt of the conductor windings 610.

Figure 7A:
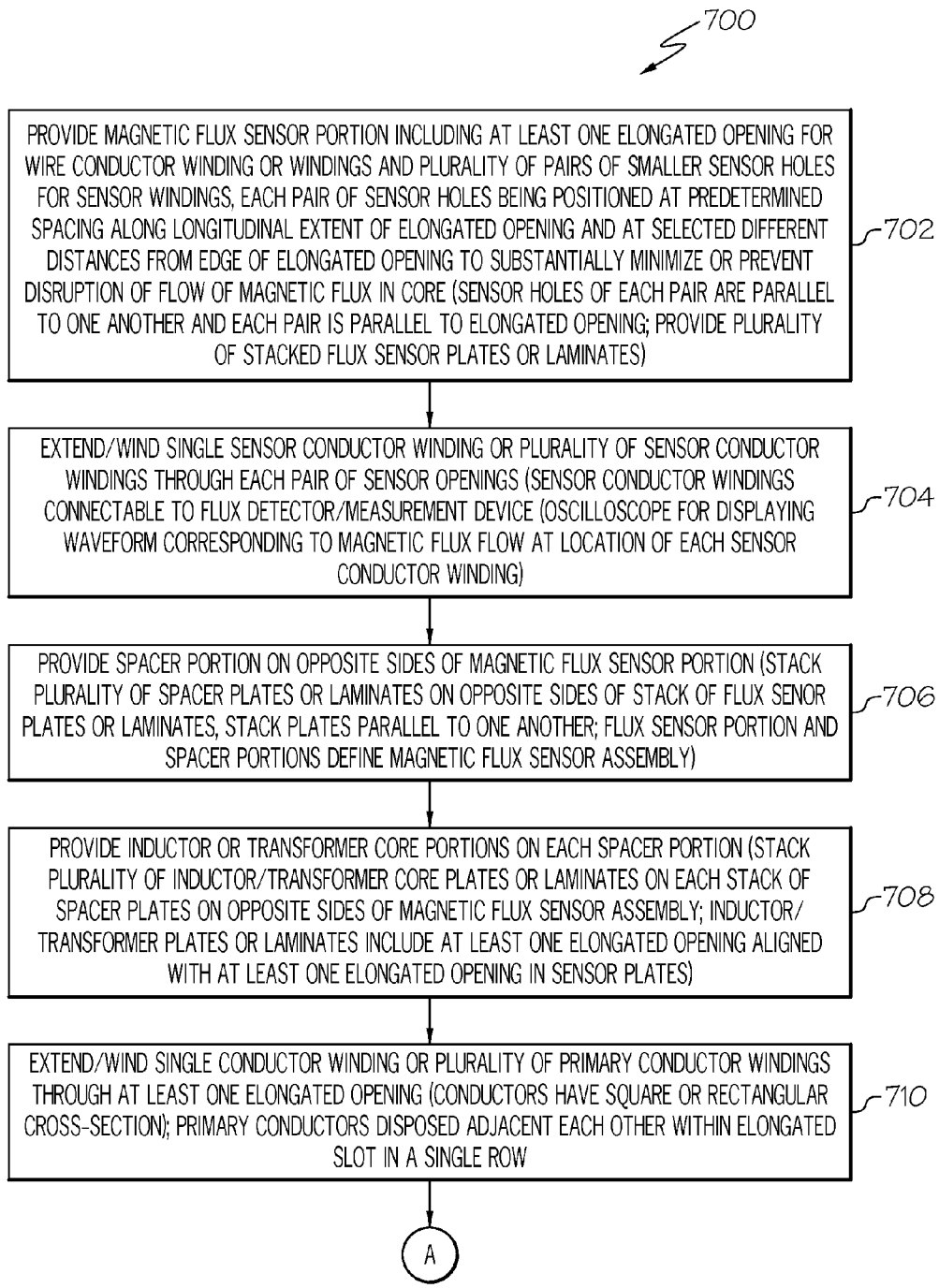
FIGS. 7A and 7B (collectively FIG. 7) are a flow chart of an example of a method for detecting and measuring magnetic flux intensity in a core of an electromagnetic device in accordance with an embodiment of the present disclosure.
Figure 7B:
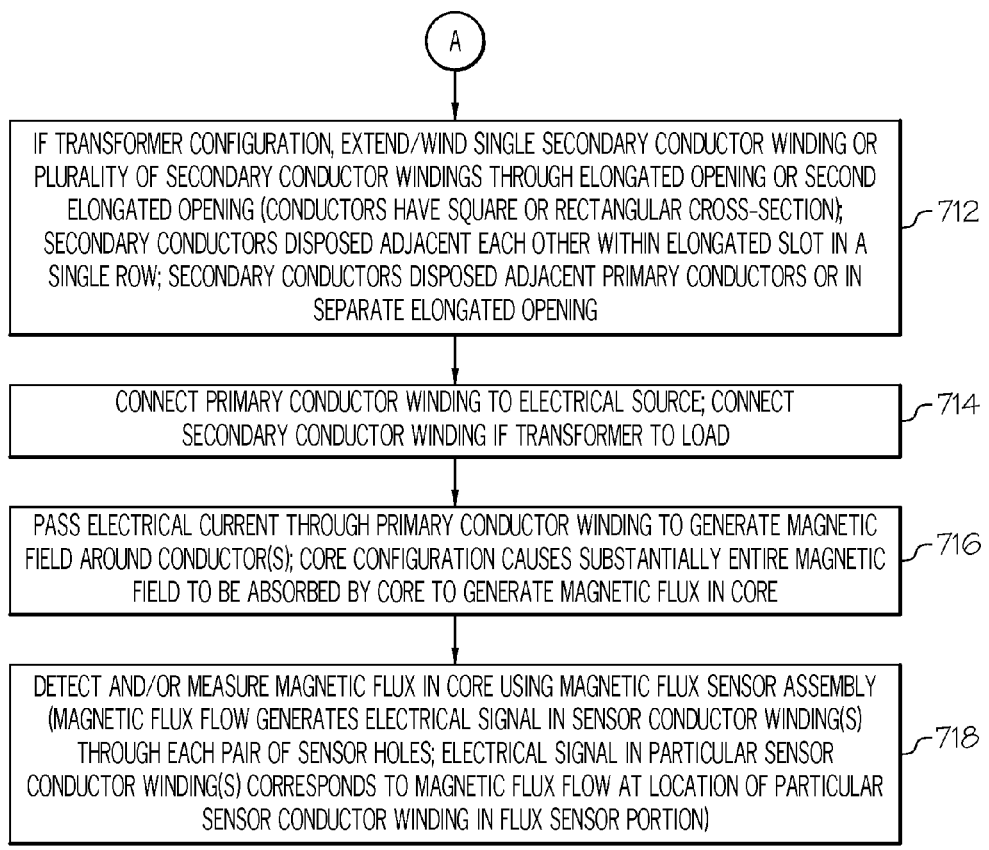

FIGS. 7A and 7B (collectively FIG. 7) are a flow chart of an example of a method 700 for detecting and measuring magnetic flux intensity in a core of an electromagnetic device in accordance with an embodiment of the present disclosure. The method 700 may be used for by the flux sensor assembly 100 and electromagnetic devices 400 and 600 described with reference to FIGS. 1, 4 and 6.

In block 702, a magnetic flux sensor assembly including a magnetic flux sensor portion may be provided. The magnetic flux sensor portion may include at least one elongated opening for a wire conductor winding or windings and a plurality of pairs of sensor holes for sensor windings. The sensor holes may be elongated holes much smaller than the elongated opening for the conductor winding or windings. Each pair of sensor holes may be positioned at a predetermined spacing along a longitudinal extent of the elongated opening and at a selected different distance from an edge of the elongated opening to substantially minimize or prevent disruption of a flow of magnetic flux in a core of the electromagnetic device. The sensor holes of each pair may be parallel to one another and each pair of sensor holes may be parallel to the elongated opening. The flux sensor portion may include a plurality of flux sensor plates or laminates stacked on one another to form the flux sensor portion similar to that previously described.

In block 704, a single sensor conductor or winding or a plurality of sensor conductors or windings may extend or wind through each pair of sensor openings. The sensor conductors or windings are connectable to a magnetic flux detector or flux measurement device. Similar that previously described the magnetic flux detector or flux measurement device may be an oscilloscope for displaying waveforms corresponding to the magnetic flux flow at a location of each sensor conductor winding through the sensor holes.

In block 706, a spacer portion may be provided on opposite sides of the magnetic flux sensor portion. The spacer portion may be a stack of a plurality of spacer plates or laminates on opposite sides of a stack of flux sensor plates or laminates. The plates may be stacked parallel to one another similar to that previously described.

In block 708, inductor or transformer core portions may be provided on each of the spacer portions. Similar to that previously described the core portions may include at least one elongated opening for the winding or windings. The inductor configuration will include a single winding or windings and the transformer configuration or assembly will include a primary winding and at least one secondary winding. The at least one elongated opening will align with the at least one opening in the sensor plates.

In block 710, a single conductor winding or a plurality of primary conductor windings may extend or wind through the at least one elongated opening. The conductors may have a substantially square or rectangular cross-section similar to that described in U.S. patent application Ser. No. 13/553, 267. The primary conductors may be disposed adjacent each other within the elongated opening or slot in a single row.

In block 712, if the electromagnetic device is a transformer, a single secondary conductor winding or a plurality of secondary conductor windings may extend or wind through the elongated opening or may extend or wind through a second elongated opening. The secondary conductor windings may also have a square or rectangular cross-section. The secondary conductors may be disposed adjacent each other within the elongated opening or slot in a single row. The secondary conductors may be disposed adjacent the primary conductors in the same elongated opening, or in another embodiment, the secondary conductor windings may be in a separate elongated opening similar to that described in U.S. patent application Ser. No. 13/553, 267.

In block 714, if the electromagnetic device is a transformer, the primary conductor winding or windings may be connected to an electrical source and the secondary conductor winding or windings may be connected to a load.

In block 716, an electrical current may be conducted through the primary conductor winding or windings to generate a magnetic field around the conductor or conductors. The core of the electromagnetic device may be designed to cause substantially the entire magnetic field to be absorbed by the core. A magnetic flux is generated in the core by the magnetic field.

In block 718, the magnetic flux flow in the core may be detected and/or measured using a magnetic flux sensor assembly similar to that described herein. The magnetic flux flow generates an electrical signal in the sensor conductor winding or windings through each pair of sensor holes as described herein. The electrical signal in a particular sensor conductor winding corresponds to the magnetic flux flow at a location of the particular sensor conductor winding through the sensor holes.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the embodiments herein have other applications in other environments. This application is intended to cover any adaptations or variations of the present disclosure. The following claims are in no way intended to limit the scope of the disclosure to the specific embodiments described herein.

What is claimed is:

1. A magnetic core flux sensor assembly, comprising:
   a flux sensor core portion comprising a same magnetic material throughout;
   at least one elongated opening for receiving a conductor winding through the flux sensor core portion, wherein an electrical current flowing through the conductor winding generates a magnetic field about the conductor winding and a magnetic flux flow about the at least one elongated opening in the flux sensor core portion;
   a plurality of pairs of sensor holes through the same magnetic material of the flux sensor core portion in a path of the magnetic flux flow in the same magnetic material of the flux sensor core portion and positioned relative to the at least one elongated opening for preventing significant disruption of the magnetic flux flow in the sensor core portion and for use in sensing the magnetic flux flow at different distances from an edge of the at least one elongated opening; and
   a separate sensor conductor winding through each pair of sensor holes, the magnetic flux flow generating an electrical signal in each sensor conductor winding, the electrical signal in a particular sensor conductor winding corresponding to the magnetic flux flow at a location of the particular sensor conductor winding.

2. The magnetic flux sensor assembly of claim 1, wherein the plurality of pairs of sensor holes are each consecutively spaced along a longitudinal side of the at least one elongated opening and with each consecutive pair of sensor holes at an increasing distance from an edge of the longitudinal side of the at least one elongated opening.

3. The magnetic flux sensor assembly of claim 2, wherein the plurality of consecutive pairs of sensor holes are spaced at a predetermined distance from one another along the longitudinal side of the at least one elongated opening.

4. The magnetic flux sensor assembly of claim 3, wherein a first sensor hole of each pair of sensor holes is closer to the longitudinal side of the at least one elongated opening than a second sensor hole of each pair of sensor holes.

5. The magnetic flux sensor assembly of claim 4, wherein the sensor holes of each pair of sensor holes are the same distance apart.

6. The magnetic flux sensor assembly of claim 2, wherein a first sensor hole of a first pair of sensor holes is at a selected distance from the edge of the at least one elongated opening, a distance of a first sensor hole of each consecutive pair of sensor holes increasing in distance from the edge of the at least one elongated opening by about half the selected distance.

7. The magnetic flux sensor assembly of claim 6, wherein the first sensor hole and a second sensor hole of each pair of sensor holes are separated by the selected distance, the second sensor hole being the selected distance farther from the longitudinal edge of the at least one elongated opening than the first sensor hole of each pair of sensor holes.

8. The magnetic flux sensor assembly of claim 1, wherein the plurality of pairs of sensor holes are both sides of the at least one elongated opening.

9. The magnetic flux sensor assembly of claim 1, wherein each of the sensor holes is an elongated opening.

10. The magnetic flux sensor assembly of claim 1, wherein the flux sensor core portion comprises a plurality of flux sensor core plates stacked on one another, the at least one elongated opening and the plurality of pairs of sensor holes being formed in each flux sensor core plate.

11. The magnetic flux sensor assembly of claim 10, further comprising a spacer portion disposed on each outside flux sensor core plate, the spacer portion comprising an opening, the conductor winding passing through the spacer portion opening.

12. The magnetic flux sensor assembly of claim 11, wherein each spacer portion comprises a plurality of spacer plates stacked on one another.

13. The magnetic flux sensor assembly of claim 11, wherein the spacer portion comprises a gap for the sensor conductor winding through each pair of sensor holes to connect to a device for detecting the magnetic flux flow at the location of each sensor conductor winding.

14. An electromagnetic device, comprising:
a flux sensor core portion;
at least one elongated opening for receiving a conductor winding through the flux sensor core portion, wherein an electrical current flowing through the conductor winding generates a magnetic field about the conductor winding and a magnetic flux flow about the at least one elongated opening in the flux sensor core portion;
a plurality of pairs of sensor holes positioned relative to the at least one elongated opening for preventing significant disruption of the magnetic flux flow in the sensor core portion and for use in sensing the magnetic flux flow at different distances from an edge of the at least one elongated opening;
a sensor conductor winding through each pair of sensor holes, the magnetic flux flow generating an electrical signal in each sensor conductor winding, the electrical signal in a particular sensor conductor winding corresponding to the magnetic flux flow at a location of the particular sensor conductor winding;
a spacer portion disposed on opposite sides of the flux sensor core, the spacer portion comprising an opening, the conductor winding passing through the spacer portion opening; and
a magnetic core portion disposed on each spacer portion, wherein the at least one elongated opening extends through the magnetic core portion, the conductor winding extending through each magnetic core portion, and wherein the spacer portion comprises a gap for the sensor conductor winding through each pair of sensor holes to connect to a device for detecting the magnetic flux flow at the location of each sensor conductor winding.

15. The electromagnetic device of claim 14, wherein the plurality of pairs of sensor holes are each consecutively spaced along a longitudinal side of the at least one elongated opening and with each consecutive pair of sensor holes at an increasing distance from an edge of the longitudinal side of the at least one elongated opening.

16. The electromagnetic device of claim 14, further comprising:
a second elongated opening parallel to the at least one elongated opening through the flux sensor core portion and the magnetic core portion, the conductor winding passing through the second elongated opening, wherein the electrical current flowing through the conductor winding generates the magnetic field about the conductor winding and another magnetic flux flow about the second elongated opening in the flux sensor core portion and the magnetic core portion; and
a second conductor winding passing through the second elongated opening, the at least one elongated opening and the spacer portion opening.

17. The electromagnetic device of claim 16, further comprising:
another plurality of pairs of sensor holes positioned relative to the second elongated opening for preventing significant disruption of the magnetic flux flow in the sensor core portion and for use in sensing the magnetic flux flow at different distances from an edge of the second elongated opening; and
another sensor conductor winding through each pair of sensor holes positioned relative to the second elongated opening, the magnetic flux flow about the second elongated opening generating an electrical signal in each other sensor conductor winding, the electrical signal in a particular sensor conductor winding corresponding to the magnetic flux flow at the location of the particular sensor conductor winding relative to the second elongated opening.

18. A method for measuring a magnetic flux in an electromagnetic device, comprising:
providing a magnetic core flux sensor assembly comprising a flux sensor core portion and at least one elongated opening for receiving a conductor winding through the flux sensor core portion, wherein an electrical current flowing through the conductor winding generates a magnetic field about the conductor winding and a magnetic flux flow about the at least one elongated opening in the flux sensor core portion, the flux sensor core portion comprising a same magnetic material throughout;

providing a plurality of pairs of sensor holes through the same magnetic material of the flux sensor core portion in a path of the magnetic flux flow in the same magnetic material of the flux sensor core portion and positioned relative to the at least one elongated opening for preventing significant disruption of the magnetic flux flow in the sensor core portion and for use in sensing the magnetic flux flow at different distances from an edge of the at least one elongated opening; and providing a separate sensor conductor winding through each pair of sensor holes, the magnetic flux flow generating an electrical signal in each sensor conductor winding, the electrical signal in a particular sensor conductor winding corresponding to the magnetic flux flow at a location of the particular sensor conductor winding.

19. The method of claim 18, wherein providing the plurality of pairs of sensor holes comprises:

spacing each of the plurality of pairs of sensor holes consecutively along a longitudinal side of the at least one elongated opening; and spacing each consecutive pair of sensor holes at an increased distance from an edge of the longitudinal side of the at least one elongated opening.

20. The method of claim 18, further comprising providing a spacer portion on opposite sides of the flux sensor core, each spacer portion providing a space between the flux sensor core and each core portion of an electromagnetic device in which the magnetic core flux sensor is inserted, the space of at least one of the spacer portions containing the sensor conductor winding through each pair of sensor holes, the spacer portion comprising a gap for the sensor conductor winding through each pair of sensor holes to connect to a device for detecting the magnetic flux flow at the location of each sensor conductor winding.

21. A magnetic core flux sensor assembly, comprising:

a flux sensor core portion comprising a same magnetic material throughout;

at least one elongated opening for receiving a conductor winding through the flux sensor core portion, wherein an electrical current flowing through the conductor winding generates a magnetic field about the conductor winding and a magnetic flux flow about the at least one elongated opening in the flux sensor core portion;

a plurality of sensor holes through the same magnetic material of the flux sensor core portion in a path of the magnetic flux flow in the same magnetic material of the flux sensor core portion, each sensor hole being positioned relative to the at least one elongated opening for preventing significant disruption of the magnetic flux flow in the sensor core portion and for use in sensing the magnetic flux flow at different distances from an edge of the at least one elongated opening; and a separate sensor conductor wire through each sensor hole, the magnetic flux flow generating an electrical signal in each sensor conductor wire, the electrical signal in a particular sensor conductor wire corresponding to the magnetic flux flow at a location of the particular sensor conductor wire.

* * * * *